(12) United States Patent
Roland et al.

(10) Patent No.: US 8,091,225 B2
(45) Date of Patent: Jan. 10, 2012

(54) METHOD OF MANUFACTURING PROBE WITH PRINTED TIP

(75) Inventors: Leonard A. Roland, Portland, OR (US); Kathleen F. Ullom, West Linn, OR (US); Ira G. Pollock, Hillsboro, OR (US); James E. Spinar, Clackamas, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 12/948,713

(22) Filed: Nov. 17, 2010

(65) Prior Publication Data

US 2011/0121849 A1    May 26, 2011

Related U.S. Application Data

(62) Division of application No. 12/206,620, filed on Sep. 8, 2008, now Pat. No. 7,940,067.

(51) Int. Cl.
*H01R 43/16* (2006.01)

(52) U.S. Cl. ........... 29/874; 29/827; 29/830; 29/831; 29/840

(58) Field of Classification Search ............ 29/874, 29/25.35, 610.1, 612, 827, 830, 831, 840; 324/754.01, 754.06, 754.07, 754.12, 755.01, 755.07, 756.03, 762.02

See application file for complete search history.

(56) References Cited

U.S. PATENT DOCUMENTS

| | | | |
|---|---|---|---|
| 4,600,907 A | 7/1986 | Grellman et al. | |
| 4,983,910 A | 1/1991 | Majidi-Ahy et al. | |
| 6,111,418 A * | 8/2000 | Okuno et al. | 324/755.06 |
| 6,181,150 B1 * | 1/2001 | Okuno | 324/756.03 |
| 6,191,594 B1 | 2/2001 | Nightingale et al. | |
| 7,091,731 B1 | 8/2006 | Holcombe et al. | |
| 7,605,596 B2 | 10/2009 | Kim et al. | |
| 2005/0140386 A1 | 6/2005 | Strid et al. | |

* cited by examiner

*Primary Examiner* — Thiem Phan
(74) *Attorney, Agent, or Firm* — Langlotz Patent and Trademarks Works, Inc.; Thomas F. Lenihan

(57) ABSTRACT

The manufacturing method of a probe with printed tip consists of a substrate having a plurality of probe tips connected to its end edge, a plurality of test paths, each connected to one of the probe tips and extending along the substrate, and at least one of the test paths including an electrical component adjacent to the test path's probe tip. The electrical component may be a resistor. The probe tips may have a width equal to the thickness of the substrate. The probe tips may consist of a plurality of probe tip layers. The invention also includes a method of probing signals transmitted over target transmission lines on a target board. The disclosure also includes a method of manufacturing the claimed invention.

8 Claims, 11 Drawing Sheets

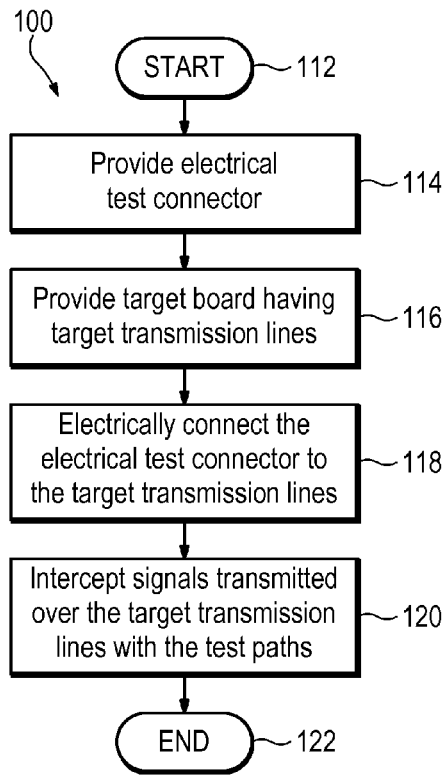
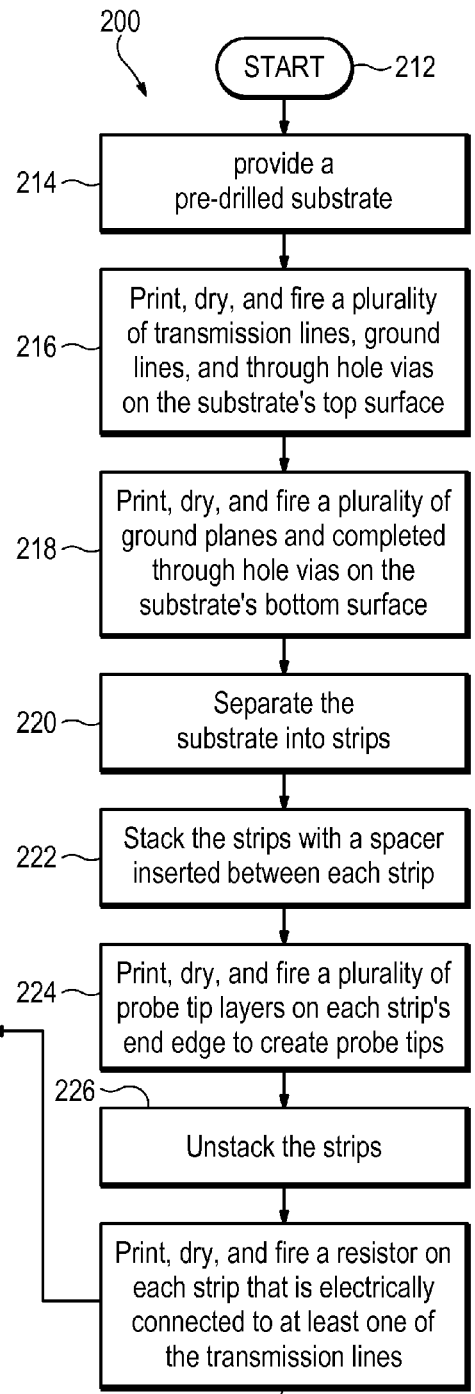
FIG.6
FIG.7

_METHOD OF MANUFACTURING PROBE WITH PRINTED TIP_

CROSS REFERENCE TO RELATED PATENT APPLICATION

The subject application is a divisional application of U.S. patent application Ser. No. 12/206,620 PROBE WITH PRINTED TIP, (Roland, et al.), filed 8 Sep. 2008 now U.S. Pat. No. 7,940,067, which was assigned to the same assignee as the subject case.

FIELD OF THE INVENTION

The present invention relates to a probe with printed tip for use in connection with the high impedance probing and high fidelity replication of microwave signals in an electronic device. The probe with printed tip has particular utility in connection with probing signals carried by a transmission line on a target board and transferring them to an oscilloscope for analysis.

BACKGROUND OF THE INVENTION

Probes with printed tips are desirable for probing signals carried by a transmission line on a target board and transferring them to an oscilloscope for analysis. Measuring electrical signals carried by a transmission line on a target printed circuit board to determine their electrical characteristics is an important part of validating or troubleshooting a circuit performance. Signal measurement and analysis can also be useful in a service and repair environment to diagnose malfunctions.

Demand for higher data transfer rates and signal frequencies have created a need for printed circuit boards to transmit signals at ever-increasing frequencies with the accompanying need for probes that can faithfully replicate these rates and frequencies without disturbing the target signal. At high frequencies, such as microwave frequencies, existing probes have three undesirable features:

1. Capacitive loading of the transmission line being measured because of the proximity of the probe material. This disrupts the impedance of the line at the point being measured and causes reflections.
2. Inductive intervention of the probe because of the length of its probe tip. This inductance in series with the probe tip limits the bandwidth of the probe.
3. The basic shunt impedance of the probe itself.

The use of edge contacts on probes is known in the prior art. For example, edge printing has been used on hybrids to create wraparound connections, and crenellation vias have been used on printed circuit boards. However, these contacts are used to push up against an intervening material used to probe, which is usually an elastomeric material. Other implementations of an edge print form the probe tip through the addition of a soldered or epoxied wire.

Therefore, a need exists for a new and improved probe with printed tip that can be used for probing signals carried by a transmission line on a target board directly without the need for an extra mechanical extension and transferring them to an oscilloscope for analysis. In this regard, the various embodiments of the present invention substantially fulfill at least some of these needs. In this respect, the probe with printed tip according to the present invention substantially departs from the conventional concepts and designs of the prior art, and in doing so provides an apparatus primarily developed for the purpose of probing broadband microwave signals carried by a transmission line on a target board without circuit disruption and then routing them with high fidelity to an oscilloscope for analysis.

SUMMARY OF THE INVENTION

The present invention provides an improved probe with printed tip, and overcomes the above-mentioned disadvantages and drawbacks of the prior art including capacitive loading of the transmission line being measured and inductive intervention of the probe. As such, the general purpose of the present invention, which will be described subsequently in greater detail, is to provide an improved probe with printed tip that has all the advantages of the prior art mentioned above.

To attain this, the preferred embodiment of the present invention essentially comprises a substrate having a plurality of probe tips printed on its end edge, a plurality of test paths, each connected to one of the probe tips and extending along the substrate, and at least one of the test paths including an electrical component adjacent to the test path's probe tip. The electrical component may be a resistor. The probe tips may have a width equal to the thickness of the substrate. The probe tips may consist of a plurality of probe tip layers. The invention also includes a method of probing signals transmitted over target transmission lines on a target board. The invention also includes a method of manufacturing an electrical test connector. There are, of course, additional features of the invention that will be described hereinafter and which will form the subject matter of the claims attached.

There has thus been outlined, rather broadly, the more important features of the invention in order that the detailed description thereof that follows may be better understood and in order that the present contribution to the art may be better appreciated.

BRIEF DESCRIPTION OF THE DRAWINGS

FIG. 6 is a flowchart view of the method of probing signals transmitted over target transmission lines on a target board of the present invention.

FIG. 7 is a flowchart view of the method of manufacturing the probe with printed tip of the present invention.

The same reference numerals refer to the same parts throughout the various figures.

DESCRIPTION OF THE CURRENT EMBODIMENT

Figure 1:
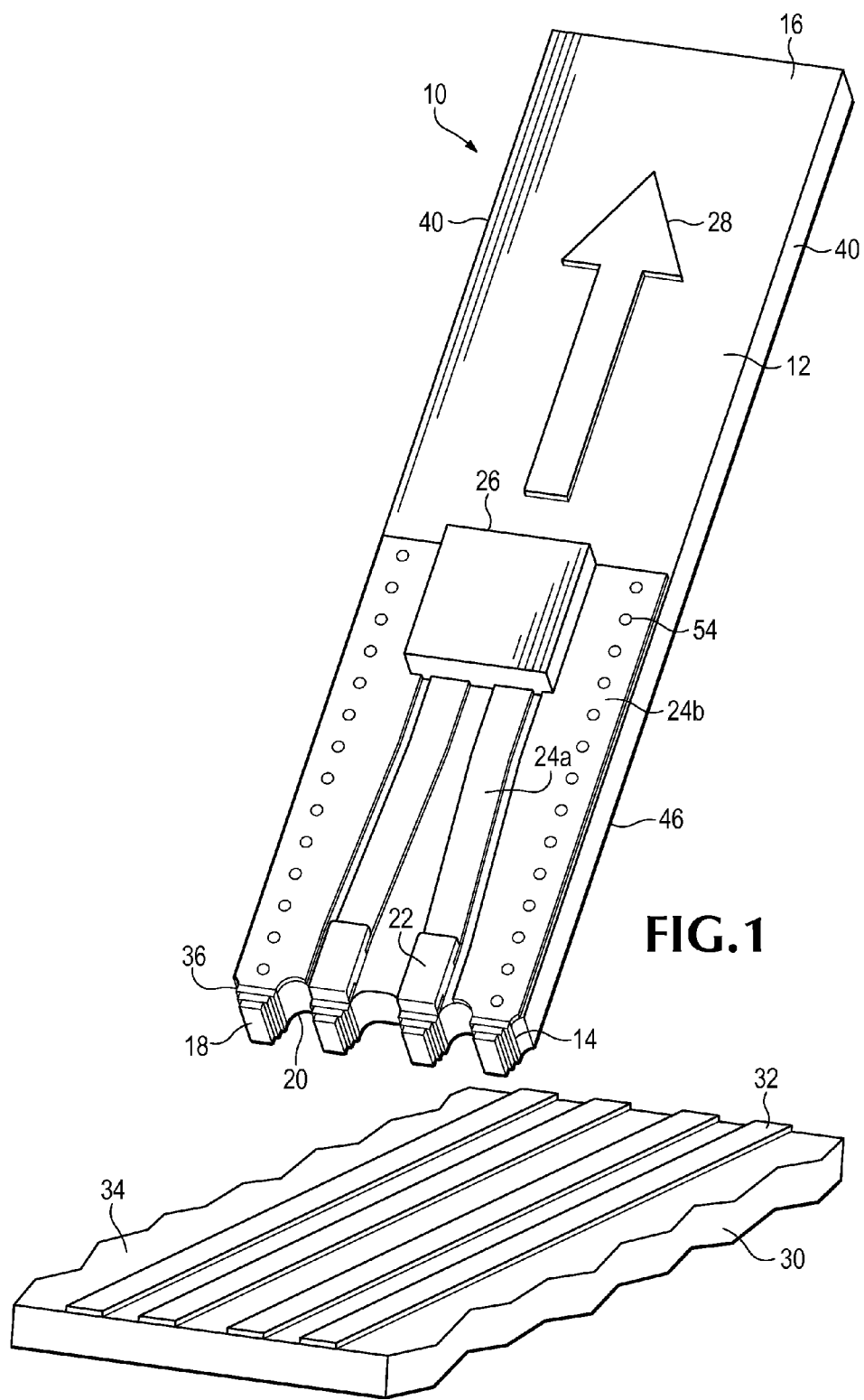
FIG. 1 is a top perspective view of the current embodiment of the probe with printed tip constructed in accordance with the principles of the present invention.

A preferred embodiment of the apparatus for a test and measurement instrument of the present invention is shown and generally designated by the reference numeral 10.

FIG. 1 illustrates improved probe with printed tip 10 of the present invention. More particularly, probe with printed tip 10 is depicted in use with a target board 30 having target transmission lines 32 separated from one another by dielectric 34. The probe with printed tip 10 has a substrate 12 with a top surface 16, an end edge 14, two side edges 40, and a bottom surface 46. A plurality of probe tips 18 are thick film printed onto the end edge 14. Crenellations 20 separate the probe tips 18 from one another and from the side edges 40. Transmission lines 24a and ground lines or areas 24b that are printed on the top surface 16 electrically connect probe tips 18 to a buffer 26. Resistors 22, which are film resistors in the current embodiment, are positioned between the probe tips 18 and the buffer 26 where needed. The resistors 22 isolate the signals from the buffer 26 to prevent interference with signal transmission over the target transmission lines 32. Resistor 22 also serves to reduce the shunt loading mentioned previously. The resistors 22 are present on the non-ground transmission lines 24a. In the current embodiment, the substrate is a ceramic made of alumina and the probe tips 18 are made of gold; however, any printable and durable material may be used. The resistors 22 are thick or thin film printed or attached surface mount component in the current embodiment.

Figure 9:
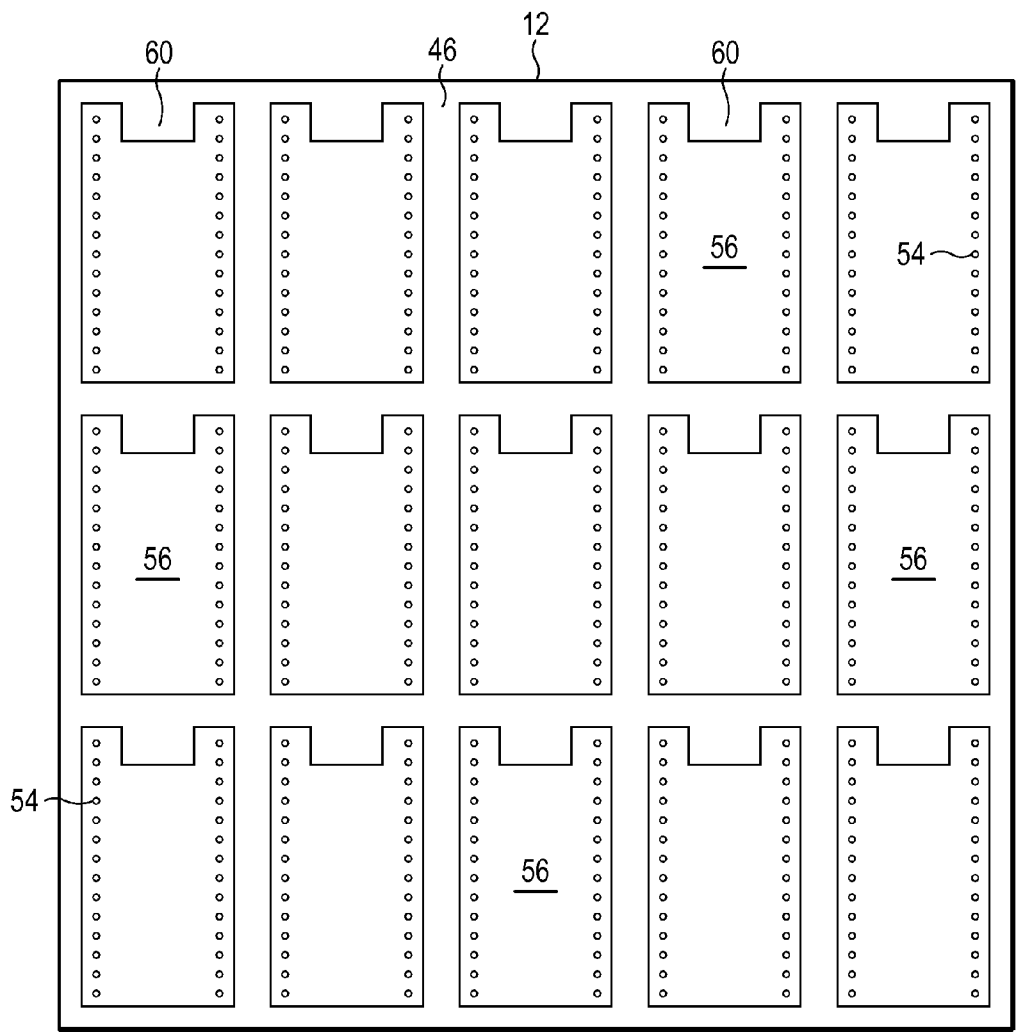
Figure 10:
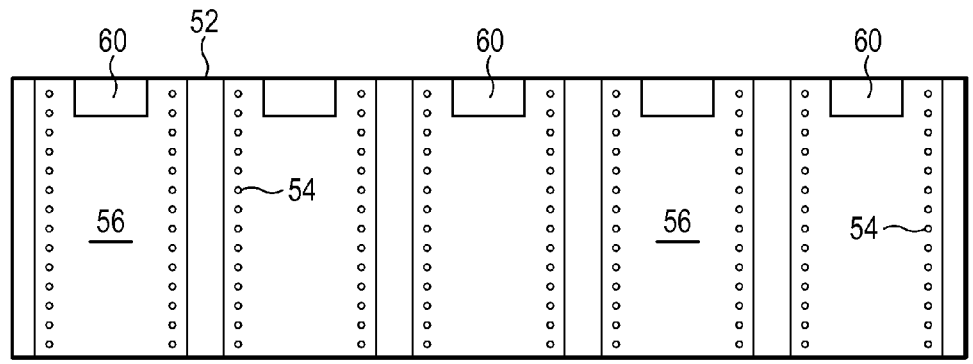
Figure 11A:
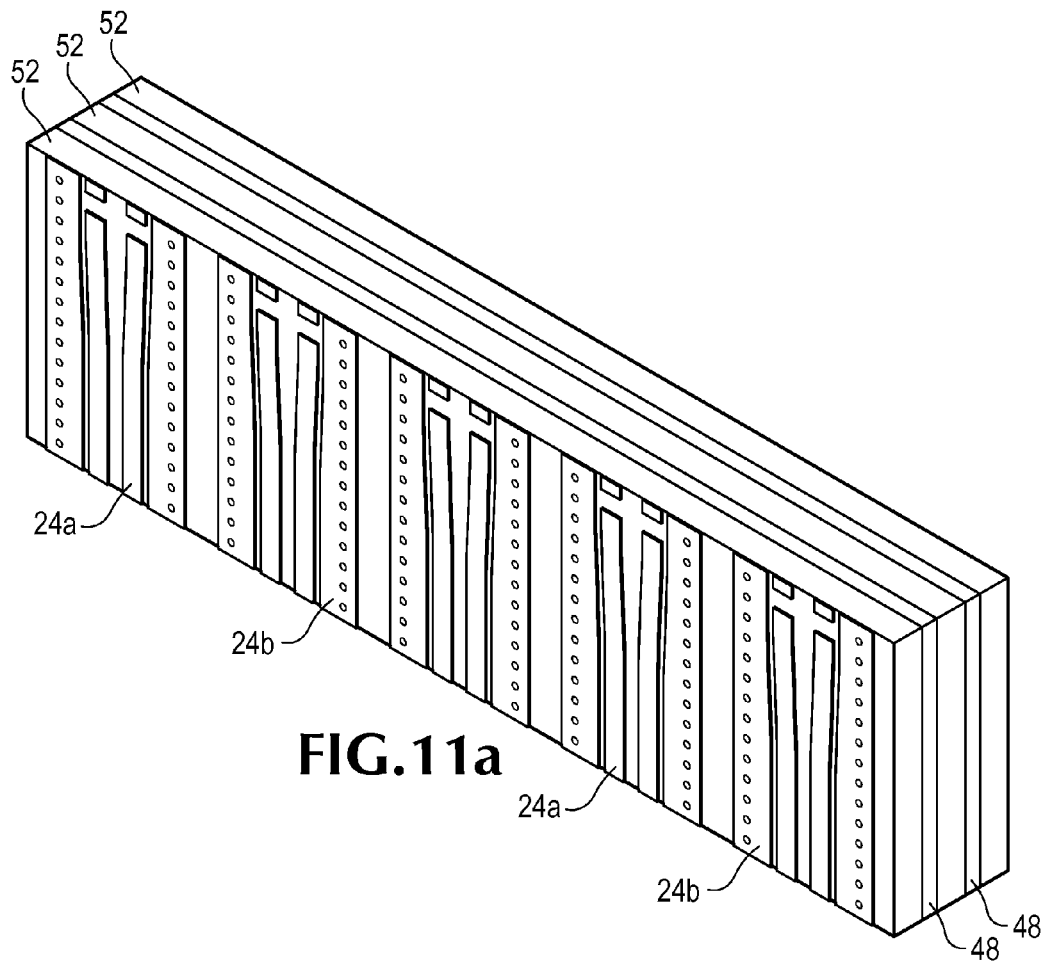
Figure 11B:
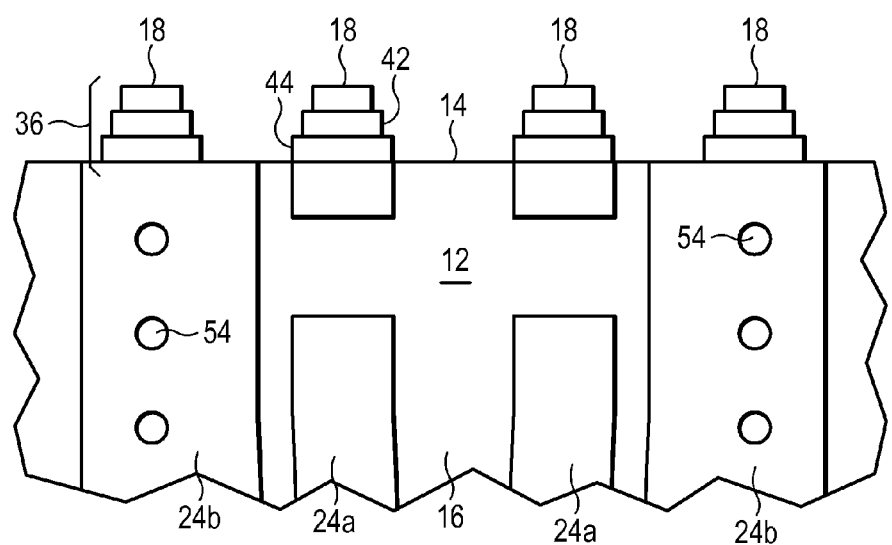
Figure 11C:
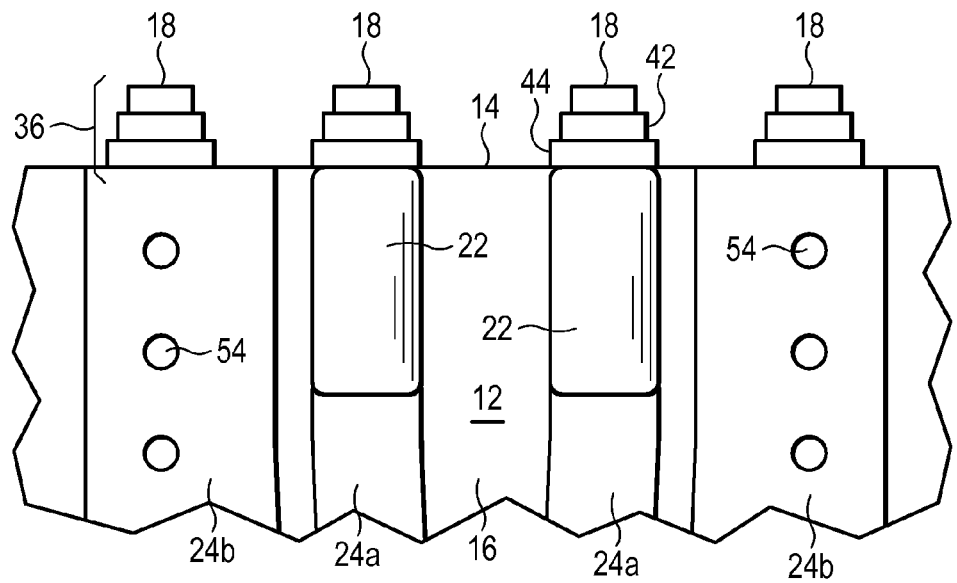
Figure 11D:
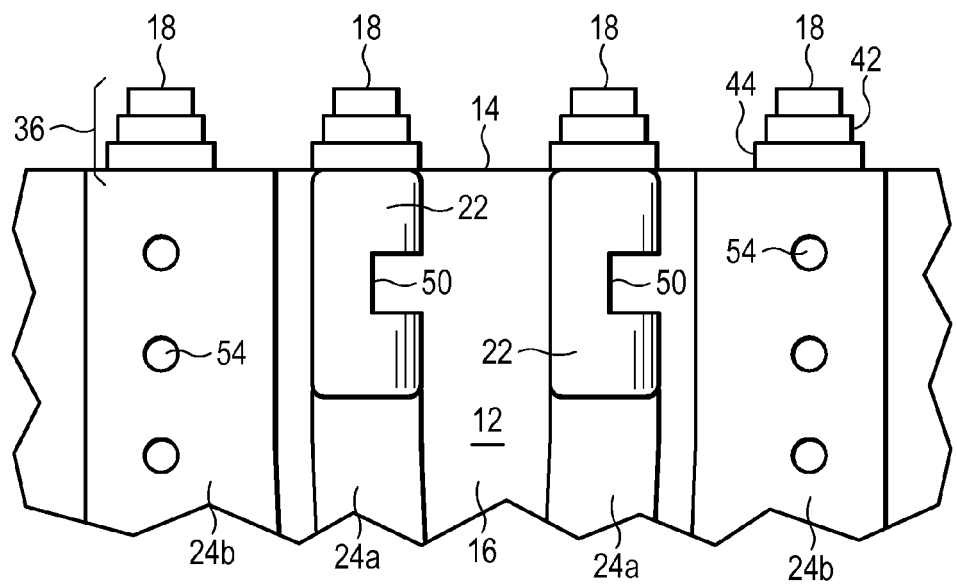
Figure 11E:
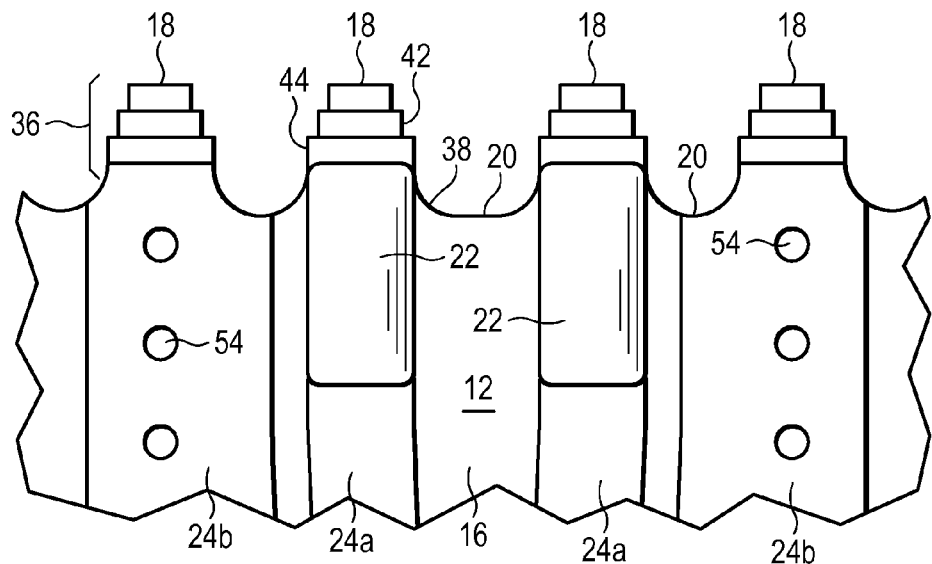
Figure 11F:
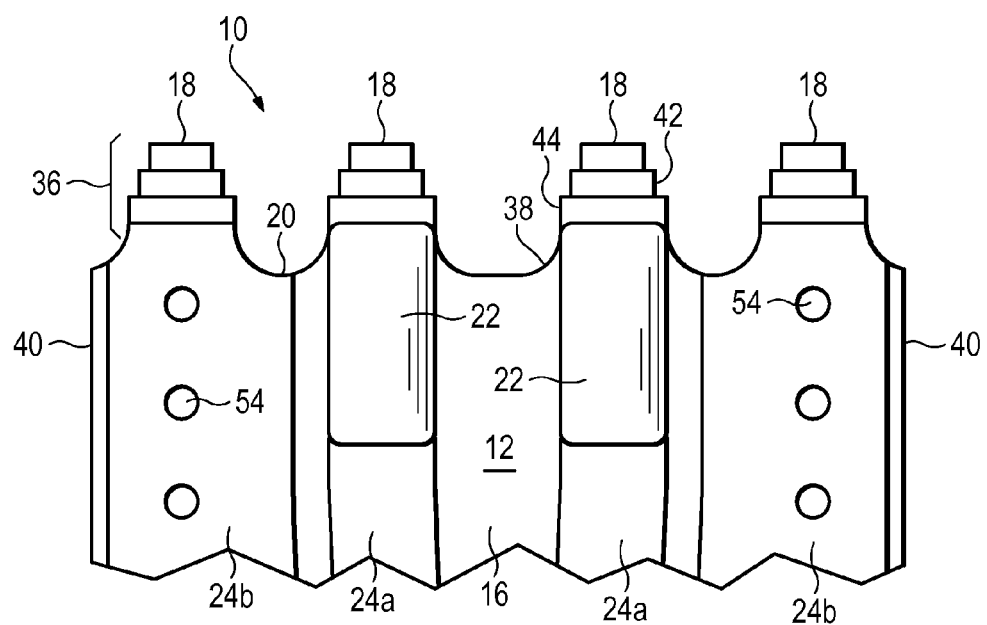

When the probe with printed tips 10 is in use, a probe tip 18 is placed in electrical contact with each target transmission line 32 whose signal is to be measured. The target transmission lines 32 and dielectric 34 are spaced to match the probe tips 18. The signal passes through transmission lines 24a with minimal interference. Where a resistor 22 is present, the transmission lines 32 are connected through a higher impedance path to the buffer 26. The buffer 26 copies the probed signals, amplifies the signal copies, and drives the buffered signal 28 to an oscilloscope. The probe tips 18 that serve as ground contacts are connected to a top surface 12 gound line or area 24b and the bottom surface 46 patterned conductor 56 (shown in FIGS. 3, 9, and 10) by through hole vias 54.

Figure 2:
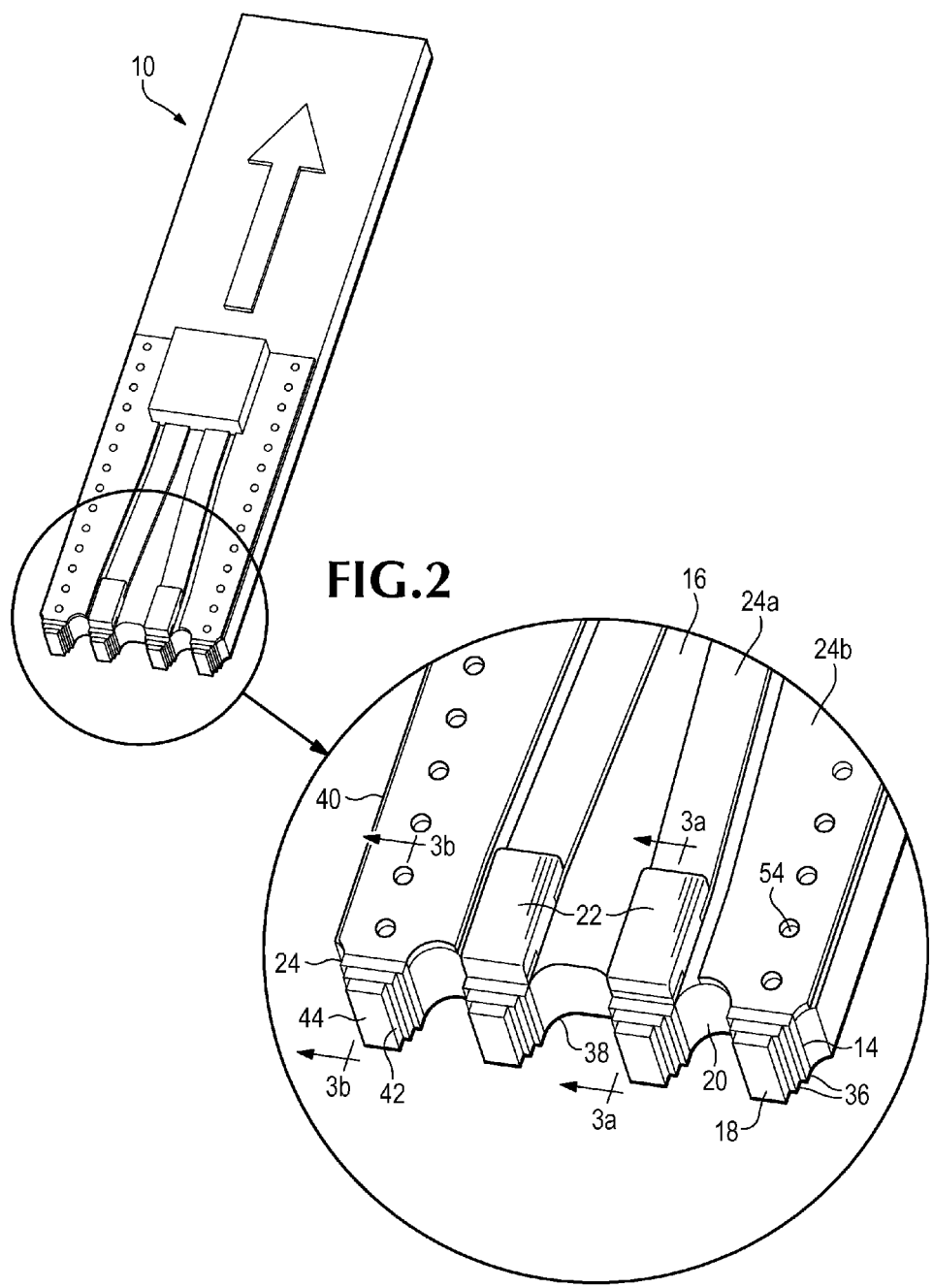
FIG. 2 is an enlarged top perspective fragmentary view of the current embodiment of the probe with printed tip constructed in accordance with the principles of the present invention.

FIG. 2 illustrates an enlarged top perspective fragmentary view of the probe with printed tip 10. Each of the probe tips 18 comprises multiple probe tip layers 36 that are printed on top of one another. The probe tip layers 36 are generally rectangular in shape, with the exception of the probe tip layer 36 that is directly attached to the end edge 14, which can be square as well as rectangular. Each printing after the first covers less area than the previous one, creating a stepped taper on the sides 42 of the probe tips 18. In the current embodiment, the quantity of probe tip layers 36 ranges from three to eight, with the largest probe tip layer 36 being attached to the end edge 14 and the smallest probe tip layer 36 being the farthest away from the end edge 14. The probe tips 18 have a length extending from the top surface 16 to the bottom surface 46 of the substrate 12, which is about 15 mils (0.015 inch) in the current embodiment. The probe tip layers 36 can have a width ranging from 4 mils (0.004 inch) to 20 mils and a thickness ranging from 8 to 12μ, for the smallest probe tip layer 36 and from 1 to 1½ mils (0.001 to 0.0015 inch) for the largest probe tip layer 36. In the current embodiment, the probe tip layers 36 are attached to the end edge 14 by multiple iterations of printing, drying, and firing of thick film material.

The resistors 22 are placed on the transmission lines 24a at the end edge 14 immediately adjacent to the largest probe tip layers 36. This keeps the effective probe length very short both because the probe tips 18 are themselves short and because the path length to the resistors 22 is also very short. By using such a short probe length, the risk of adding inductive reactance to the measuring path, even at high frequencies, is significantly reduced because inductive reactance is approximately linearly with probe length.

The presence of the crenellations 20 also further reduces capacitive loading problems. If the substrate 12 material were to run perpendicularly between the probe tips 18, more fringing capacitance would exist because the dielectric constant of the ceramic is higher than air. By using crenellations 20 ranging from 10 to 30 mils (0.010 to 0.030 inch) in width, the probe with printed tip's 10 performance is improved by moving the high dielectric constant ceramic material away from the target transmission line 32 being probed. The crenellations 20 are created by drilling the substrate 12 with a $CO_2$ laser beam in the current embodiment. The laser beam's radius determines the minimum radius of the crenellation corners 38. The crenellations 20 are nominally sized so that the width of the crenellation fits between the largest probe tip layers 36.

Figure 3A:
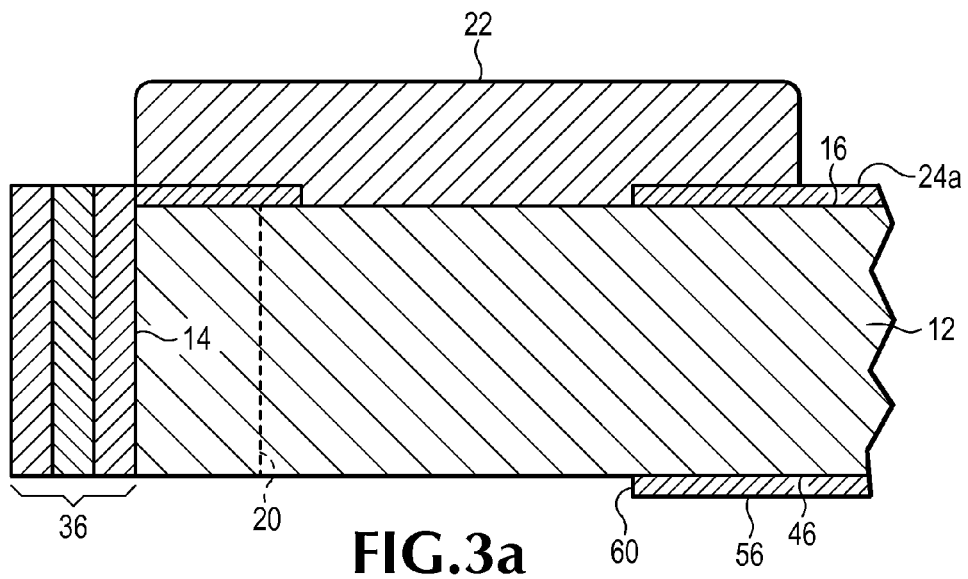
FIGS. 3a and 3b are cross-section views of the current embodiment of the probe with printed tip constructed in accordance with the principles of the present invention taken along the lines 3a-3a and 3b-3b of FIG. 2, respectively.
Figure 3B:
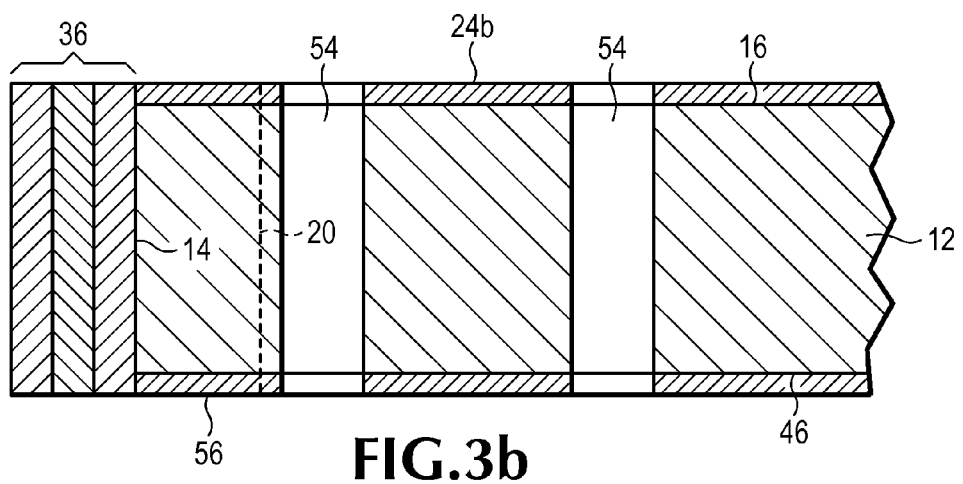
Figure 8:
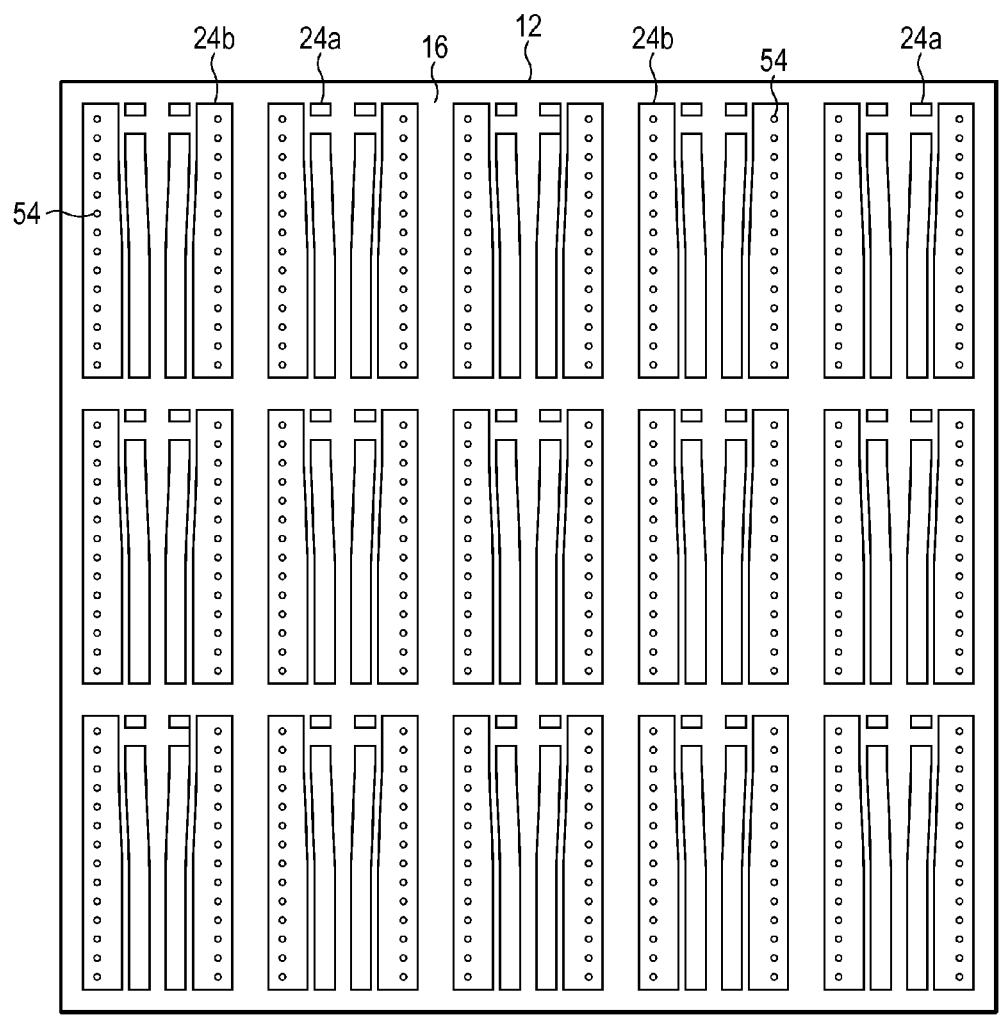
FIGS. 8-11f are side views of the work in process resulting from the method of manufacturing the section of the probe from the printed tip to the buffer amplifier of the present invention.

FIG. 3a illustrates cross-section view of the probe with printed tip 10 taken along the line 3a-3a of FIG. 2, where a resistor 22 is present. FIG. 3b illustrates cross-section view of the probe with printed tip 10 taken along the line 3b-3b of FIG. 2, where a resistor 22 is absent. In both figures, transmission lines 24a and ground line or area 24b have been printed onto the top surface 16, and a patterned ground plane 56 has been printed on the bottom surface 46 of substrate 12. However, in FIG. 3a, the ground plane 56 on the bottom surface 46 terminates short of the end edge 14 forming a gap 60. In addition, the transmission line 24 on the top surface 46 shown in FIG. 3a has a gap that is filled by resistor 22. The ground plane 56 does not connect to the bottom of the probe tips 18 that have a resistor 22 because this would electrically short the probe tips 18 to ground on their bottom side. The ground plane 56 and ground lines or area 24b are needed to form a transmission line between the resistor 22 and the buffer 26. In both figures, a plurality of probe tip layers 36 are attached to the end edge 14. Plated conductive through hole vias 54 (also shown in FIGS. 8-10) form a conductive path connecting ("stapling") the ground plane 56 to ground lines or areas 24b. Alternatively, edge plating, edge printing, and conductive mechanical clips contacting the top surface 16 ground line or area conductor 24b and the bottom surface 46 ground plane 56 of the substrate 12 can be used instead of the through hole vias 54.

The through hole vias 54 are generally connected to outer ground lines or areas 24b on the top surface 16, but the placement of the conductive through hole vias 54 and ground lines or areas 24b is not restricted. The through hole vias 56 are arrayed along the full length of the ground planes 56. The spacing between the through hole vias 54 is less than ¼ of the uppermost wavelength of the signal to be measured. At 40 GHz, the distance between the through hole vias edges is about 35 mils (0.035 inch). The through hole vias 54 are staggered to avoid a creating fragile line that can fracture.

Figure 4:
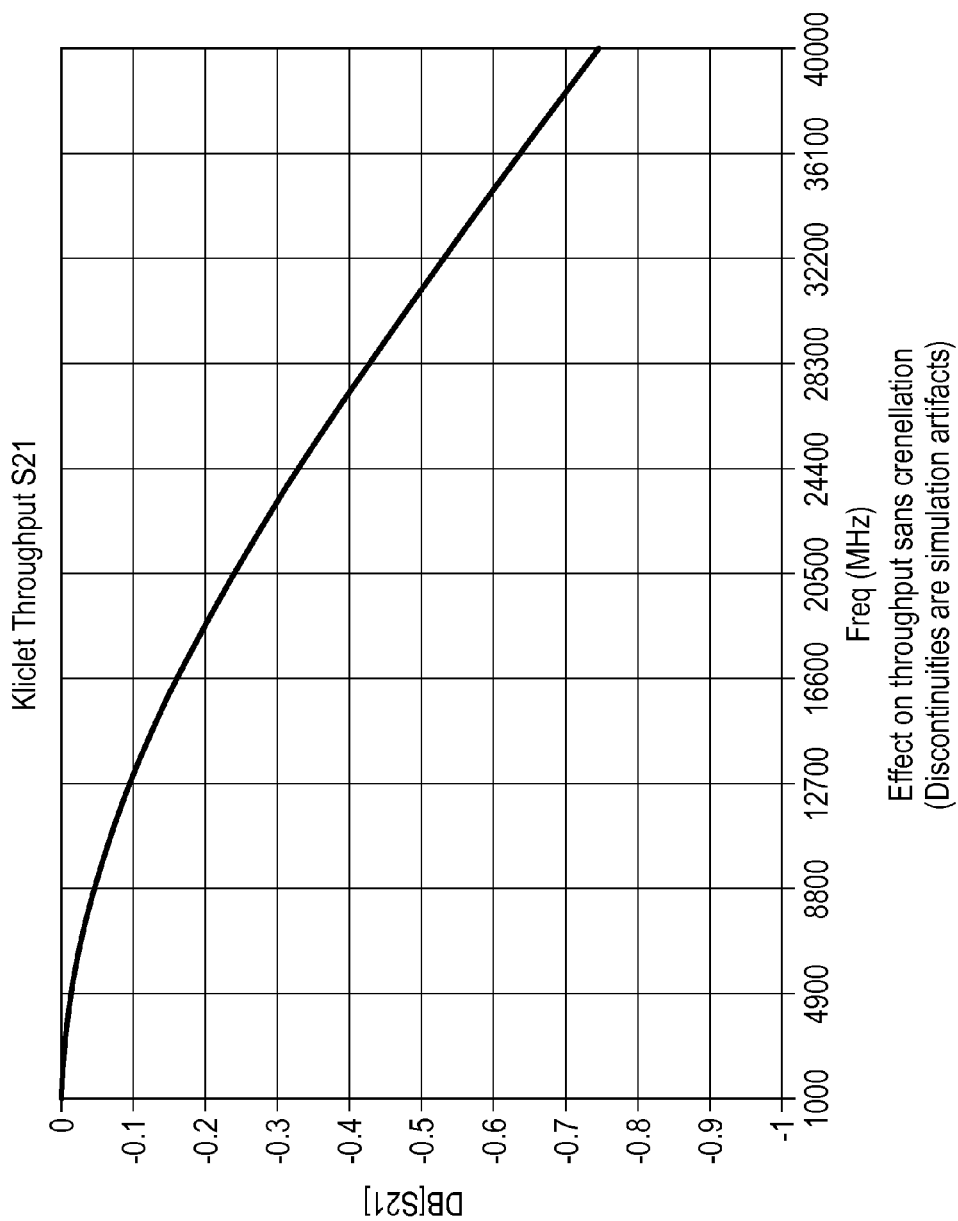
FIG. 4 is a graph depicting the signal loss experienced using the present invention without crenellations.
Figure 5:
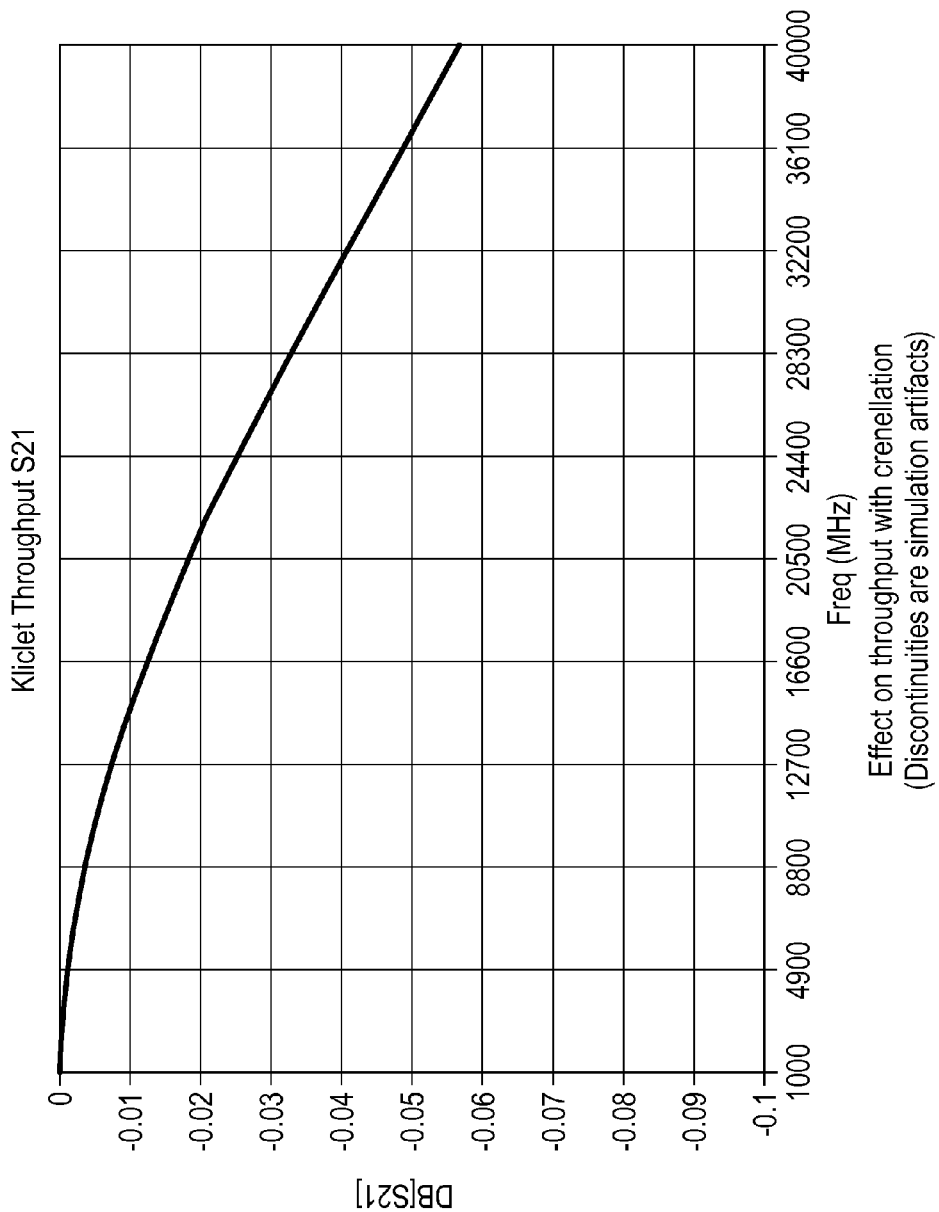
FIG. 5 is a graph depicting the signal loss experienced using the present invention with crenellations.

As is illustrated in FIGS. 4 and 5, much less signal loss (measured in dB) occurs with the present invention at higher frequencies when crenellations 20 are present (FIG. 5) compared to when they are not (FIG. 4). The insertion loss discontinuity at 40 GHz created by an edge printed probe 10 with a width of 15 mils (0.015 inch) when it comes into contact with a target transmission line 32 on the target board 30 is only 0.06 dB for the crenellated version compared to 0.8 dB for the non-crenellated version.

FIG. 6 illustrates a method of probing signals transmitted over target transmission lines on a target board (100). The method begins (112) by providing an electrical test connector of the current invention (114) and a target board having target transmission lines (116). The electrical test connector is subsequently electrically connected to the target transmission lines on a target board by placing the probe tips in contact with the target transmission lines (118). Signals transmitted over the target transmission lines are probed by the test paths on the electrical test connector (120) prior to the method's termination (122).

FIG. 7-11f illustrate a method of manufacturing the probe with printed tip 10 (200). The method begins (212) by providing a pre-drilled substrate 12 (214). A plurality of transmission lines 24a, ground lines or areas 24b, and through hole vias 56 are printed, dried, and fired on the substrate 12's top surface 16 (216) [see FIG. 8], and a patterned ground plane 56 and completed through hole vias 56 are printed, dried, and fired on the substrate 12's bottom surface 46 (218) [see FIG. 9]. The substrate 12 is then separated into strips 52, typically by a saw (220) [see FIG. 10]. The strips 52 are then stacked with a spacer 48 inserted between each strip 52 (222) [see FIG. 11a]. The spacers 48 prevent the strips 52 from been inadvertently bonded to one another while probe tips 18 are formed. A plurality of probe tip layers 36 are then printed, dried, and fired on each strip 52's end edge 14 to create probe tips 18 (224) [see FIG. 11b]. Once the strips 52 are unstacked (226), resistors 22 are printed, dried, and fired on each strip 52 that is electrically connected to at least one of the transmission lines 24a (228) [see FIG. 11c]. Any resistors 22 that are out of specification are brought into specification by trimming them to form kerfs 50 (230) [see FIG. 11d]. This is an optional step. Crenellations 20 are then cut in each strip 52's end edge 14 between the probe tips 18, typically by a $CO_2$ laser (232) [see FIG. 14], and then at least one electrical test connector 10 is separated from each strip 52, typically by a saw (234) [see FIG. 15] prior to the method's completion (236).

While current embodiments of the probe with printed tip have been described in detail, it should be apparent that modifications and variations thereto are possible, all of which fall within the true spirit and scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. For example, any suitable substrate thickness and corresponding probe tip length may be used instead of the 15 mils (0.015 inch) described.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A method of manufacturing an electrical test connector comprising the steps of:
   providing a substrate having a top surface and a bottom surface;
   forming a plurality of transmission lines on the substrate's top surface;
   forming a patterned ground plane on the substrate's bottom surface;
   forming a conductive path connecting the ground plane on the bottom surface to selected transmission lines on the top surface;
   separating the substrate into a plurality of strips, each strip having a top surface, an end edge, and a bottom surface;
   forming a plurality of probe tips by printing a plurality of probe tip layers per probe tip on each strip's end edge; and
   separating an individual electrical test connector from each strip.

2. The method of manufacturing an electrical test connector of claim 1, further comprising the step of forming a resistor on each strip that is electrically connected in series between one of the transmission lines and a probe tip prior to the step of separating at least one electrical test connector from each strip.

3. The method of manufacturing an electrical test connector of claim 2, further comprising the step of bringing any resistors that are out of specification into specification by trimming them.

4. The method of manufacturing an electrical test connector of claim 1, further comprising the step of cutting crenellations in each strip's end edge between the probe tips.

5. The method of manufacturing an electrical test connector of claim 4, wherein the step of cutting crenellations in each strip's end edge between the probe tips is performed prior to the step of separating at least one electrical test connector from each strip.

6. The method of manufacturing an electrical test connector of claim 1, wherein the strips are stacked before the probe tips are formed on each strip's end edge.

7. The method of manufacturing an electrical test connector of claim 6, wherein a spacer is inserted between each strip as they are stacked.

8. The method of manufacturing an electrical test connector of claim 6, wherein the strips are unstacked prior to the step of separating at least one electrical test connector from each strip.

* * * * *